United States Patent [19]
Tokuhiro

[11] Patent Number: 5,307,065
[45] Date of Patent: Apr. 26, 1994

[54] DIGITAL-TO-ANALOG CONVERTER

[75] Inventor: Noriyuki Tokuhiro, Yokohama, Japan

[73] Assignee: Fujitsu Limited, Kawasaki, Japan

[21] Appl. No.: 674,332

[22] PCT Filed: Aug. 20, 1990

[86] PCT No.: PCT/JP90/01055
   § 371 Date: Apr. 19, 1991
   § 102(e) Date: Apr. 19, 1991

[87] PCT Pub. No.: WO91/03105
   PCT Pub. Date: Mar. 7, 1991

[30] Foreign Application Priority Data
   Aug. 21, 1989 [JP] Japan .................. 1-214299

[51] Int. Cl.⁵ .................. H03M 1/80; H03M 1/66
[52] U.S. Cl. .................. 341/153; 341/144
[58] Field of Search ............ 341/153, 144, 154, 139

[56] References Cited
   U.S. PATENT DOCUMENTS

| | | | |
   |---|---|---|---|
   | 2,993,202 | 7/1961 | Halonen | 341/153 X |
   | 3,305,857 | 2/1967 | Barber | 341/139 |
   | 3,613,111 | 10/1971 | Paine et al. | 341/139 |
   | 3,656,151 | 4/1972 | Richeson, Jr. et al. | 341/153 X |
   | 3,735,393 | 5/1973 | Carbrey | 341/139 X |
   | 3,924,229 | 12/1975 | Liu | 341/153 X |
   | 4,020,485 | 4/1977 | Busby | 341/154 X |

FOREIGN PATENT DOCUMENTS 0018918 11/1980 European Pat. Off. .......... 341/153

*Primary Examiner*—Sharon D. Logan
*Attorney, Agent, or Firm*—Staas & Halsey

[57] ABSTRACT

A digital-to-analog converter of a current addition type using weighted resistors, includes an input resistor network (4) for providing a resistance dependent on a digital input signal having a predetermined number of bits, and an adder (3) having a first input terminal coupled to the input resistor network and a second input terminal connectable to receive a reference potential, for adding a signal obtained at the first input terminal and the reference potential. The adder also has an output terminal via which a result of an adding operation is output, and the result of the adding operation shows an analog signal corresponding to the digital input signal. The digital-to-analog converter also includes a feedback resistor network (5) provided between the first input terminal and the output terminal of the adder, the feedback resistor network providing a feedback resistance dependent on a control signal indicating a magnitude of the digital input signal, and a feedback resistor network control circuit (7) for generating the control signal indicating the magnitude of the digital input signal from the digital input signal.

18 Claims, 12 Drawing Sheets

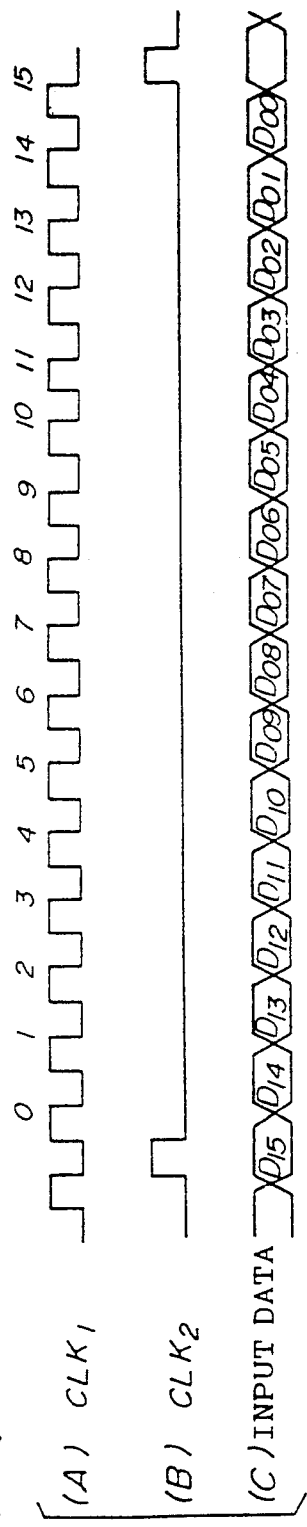
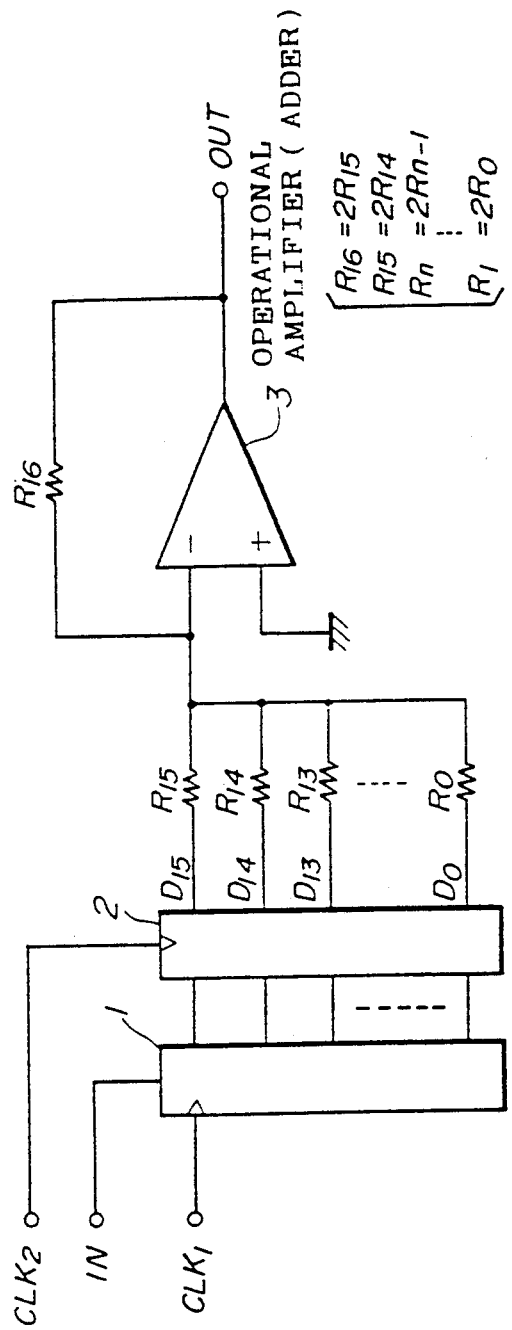
FIG. 4
FIG. 1 PRIOR ART

FIG. 6

| FIG.7A | FIG.7B | FIG.7C | FIG.7D | FIG.7E | FIG.7F |
|--------|--------|--------|--------|--------|--------|

DIGITAL-TO-ANALOG CONVERTER

BACKGROUND OF THE INVENTION

1. Field of the Invention

The present invention relates to a digital-to-analog converter which converts a quantized digital signal into an analog signal, and more specifically, to an improvement in a current addition type digital-to-analog converter which uses weighted resistors.

2. Description of the Related Art

FIG. 1 is a block diagram of a conventional current addition type 16-bit digital-to-analog converter which uses weighted resistors. A 16-bit digital signal consisting of a train of pulses, each being quantized data "1" or "0", is applied to an input terminal IN. The pulses of the digital signal are successively stored in a shift register 1 in accordance with a shift clock input to a clock terminal CLK1. The digital signal stored in the shift register 1 is input to a latch 2 in accordance with a latch pulse which is input to a clock terminal CLK2 after all the 16 bits are stored in the shift register 1. 16 output terminals D0–D15 of the latch 2 are connected, through respective resistors R0–R15, to an inverting input terminal of an operational amplifier 3, which functions as an adder.

The inverting input terminal of the operational amplifier 3 is coupled to an output terminal OUT thereof via a resistor R16, and a non-inverting input terminal thereof is grounded. The resistors R0–R16 each has a weighted resistance equal to a multiple of 2. More specifically, the following relationships are established: $R16=2R15$, $R15=2R14$, $Rn=2Rn-1$, ..., $R1=2R0$.

Assuming that voltages output via the output terminals D0–D15 of the latch 2 are V0–V15 in the above-mentioned structure, an output voltage Vout of the operational amplifier 3 is:

$$Vout = (V15/R15 + V14/R14 + ... + Vn/Rn + ... + V0/R0)R16$$

Thus, when output data via the output terminals D0–D15a are "0", zero volt is generated, and when the output data are "1", 1 volt is generated. Thus, the 16-bit digital signal which consists of 16 data pieces, each having "1" or "0", and which is input to the input terminal IN are completely converted into an analog signal.

For example, in a case where a 12-bit D/A converter is used so that it converts a 16-bit digital signal into an analog signal, it is necessary to omit any four bits of the 16 bits.

(1) Normally, in many cases, four low-order bits are omitted. In a case where the digital signal ranges equally from the strongest sound to the weakest sound, the low-order bits are omitted. In this case, if the original digital signal has no distortion, an analog signal converted from the 12-bit digital signal does not deteriorate greatly. However, weak sound components expressed by the omitted four low-order bits are lost.

(2) If there is no strong sound, four high-order bits are omitted. When weak sound components are meaningful, and strong sound components are not significant (or does not appear frequently), the four high-order bits are omitted.

(3) Some high-order bits and some low-order bits are omitted. This method is intermediate between the above-mentioned methods (1) and (2) and suitable for cases where strong and weak sound components must be handled. It should be noted that none of the above-mentioned methods (1), (2) and (3) provide a dynamic range equal to or higher than 72 dB. Further, in each of the methods (1), (2) and (3), the input has information equal to 16 bits (92 dB), while each conventional method utilizes only 12 bits (72 dB).

In the aforementioned circuit configuration, the precision of the resistance values of the resistors R0–R15 which serve as an input resistor of the operational amplifier 3 directly determines the converting precision of the digital-to-analog converter.

In the 16-bit digital-to-analog converter, the resistance ratio of the resistor R16 to the resistor R0 is equal to $2^{16}$ (=65536). Assuming that the resistor R0 is selected to have a resistance equal to 10 kΩ, the resistor R16 must have a resistance of 655.36 MΩ. It is difficult to realize such a high resistance by a highly precise resistor.

When the aforementioned digital-to-analog converter is formed on a single LSI chip, it is necessary to form large resistor cells in order to secure the required resistance precision. This leads to an increase in the chip size.

In order to overcome the problems as described above, a circuit is known which does not utilize a plurality of high-order and low-order bits. However, since predetermined high-order and low-order bits are always omitted, an output waveform may deteriorate greatly when input data mainly includes strong sound components or weak sound components.

SUMMARY OF THE INVENTION

It is an object of the present invention to provide a digital-to-analog converter in which the above-mentioned disadvantages are eliminated.

A more specific object of the present invention is to provide a digital-to-analog converter having a smaller weighted resistance ratio without reducing the dynamic range.

The above-mentioned objects of the present invention are achieved by a digital-to-analog converter of a current addition type using weighted resistors, comprising: input resistor network means for providing a resistance dependent on a digital input signal having a predetermined number of bits; addition means having a first input terminal coupled to the input resistor network means and a second input terminal connectable to receive a reference potential, for adding a signal obtained at the first input terminal and the reference potential, the addition means having an output terminal via which a result of an adding operation is output, the result of the adding operation showing an analog signal corresponding to the digital input signal; a feedback resistor network provided between the first input terminal and the output terminal of the addition means, the feedback resistor network providing a feedback resistance dependent on a control signal indicating a magnitude of the digital input signal; and feedback resistor network control means for generating the control signal indicating the magnitude of the digital input signal from the digital input signal.

The aforementioned objects of the present invention are also achieved by a digital-to-analog converter of a current addition type having weighted resistors, comprising: input resistor network means for providing a resistance dependent on a digital input signal having a predetermined number of bits; addition means having a first input terminal coupled to the input resistor network means and a second input terminal connectable to receive a reference potential, for adding a signal obtained at the first input terminal and the reference potential, the addition means having an output terminal via which a result of an adding operation is output, the result of the adding operation showing an analog signal corresponding to the digital input signal; input resistor network means comprising a smaller number of resistors than the predetermined number of bits of the digital input signal; and control means for applying a voltage dependent on a magnitude of the digital input signal to one end of each of the resistors.

BRIEF DESCRIPTION OF THE DRAWINGS

FIG. 1 is a block diagram illustrating a conventional digital-to-analog converter;

FIG. 4 is a waveform diagram showing the operation of the digital-to-analog converter shown in FIG. 3;

FIG. 6 is a diagram showing how

FIGS. 7A, 7B, 7C, 7D, 7E and 7F are respectively waveform diagrams showing the operation of the circuit shown in FIG. 5;

DESCRIPTION OF THE PREFERRED EMBODIMENTS

Figure 2:
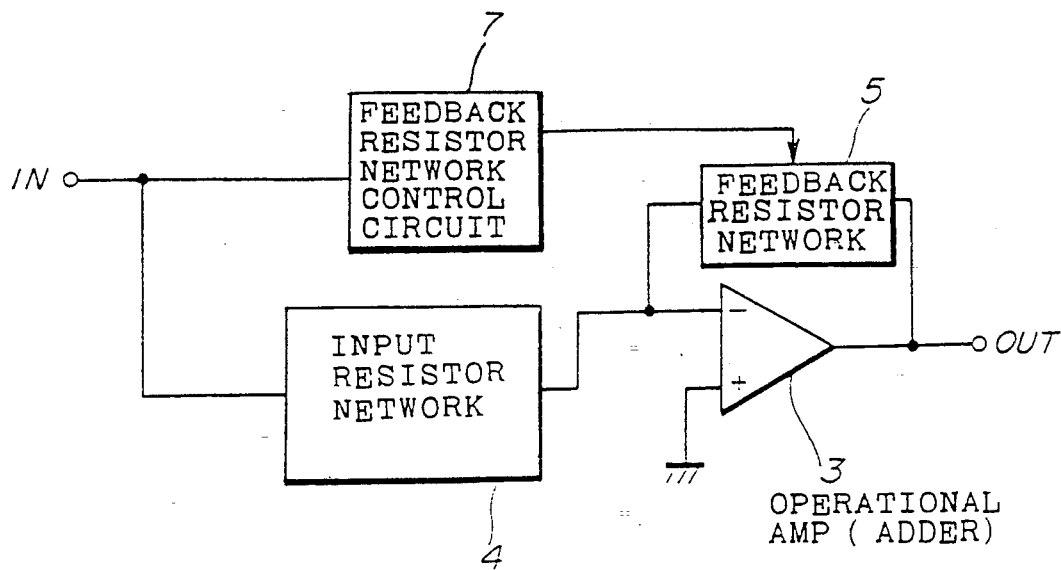
FIG. 2 is a block diagram illustrating the principle of a digital-to-analog converter according to a first embodiment of the present invention.

FIG. 2 is a block diagram illustrating the principle of a digital-to-analog converter according to the first preferred embodiment of the present invention. An input resistor network 4 is connected to an inverting input terminal IN of an adder formed of the operational amplifier 3. A feedback resistor network 5 functioning as a feedback circuit is connected between the inverting input terminal IN of the operational amplifier and the output terminal OUT thereof. The feedback resistor network 5 is subjected to a switching control based on the magnitude of an input digital signal by a feedback resistor network control circuit 7, so that the feedback resistor network 5 provides a resistance value based on the magnitude of the digital input signal.

The aforementioned resistor network shown in FIG. 1 has resistors R0-R15 provided for the respective bits of the digital input signal. On the other hand, the input resistor network 4 shown in FIG. 2 does not have resistors related to a predetermined number of high-order bits. For example, assuming that the digital input signal consists of 16 bits, the input resistor network 4 has resistors related to the respective 12 bits other than the four high-order bits. Thus, the ratio of the largest resistance related to the 12th bit to the smallest resistance related to the least significant bit is much smaller than the conventional ratio of the largest resistance to the smallest resistance. As has been described in detail later, when "1" appears for the first time starting from the most significant bit, this "1" and subsequent bits are input to the input resistor network 4. When a digital input signal (00110...) is input to the input terminal IN, the input resistor network 4 inputs 110... obtained by omitting the two high-order zero bits.

The feedback resistor network control circuit 7 varies the resistance value provided by the feedback resistor network 5 on the basis of the number of successive zeros obtained before "1" occurs for the first time starting from the most significant bit. By counting the number of successive zeros, it becomes possible to identify the magnitude of the digital input signal. For example, when two consecutive zeros appear starting from the most significant bit, the feedback resistor network 5 provides a resistance value four times that obtained when four consecutive zeros appear starting from the most significant bit.

Figure 3:
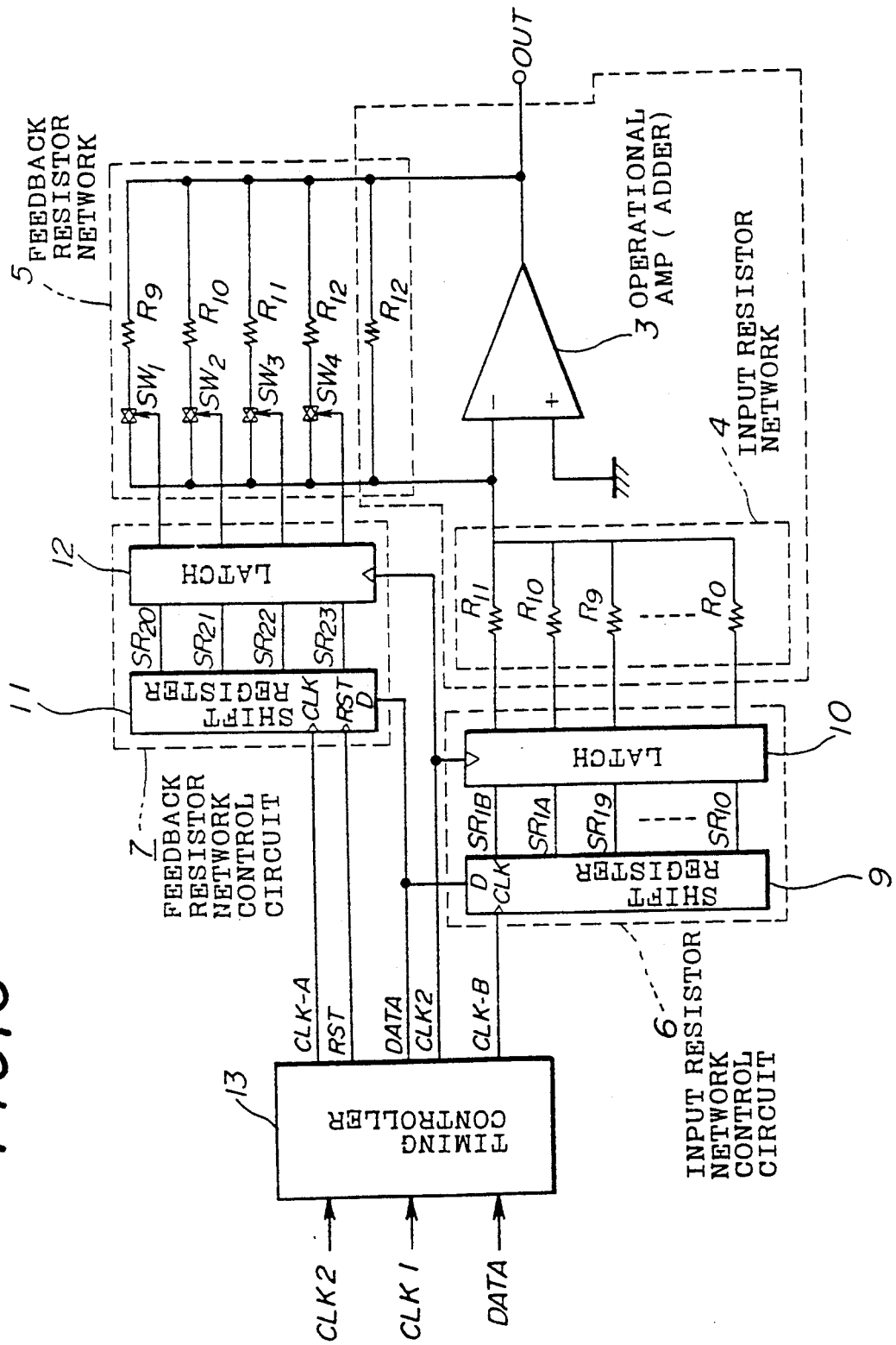
FIG. 3 is a diagram illustrating the digital-to-analog converter shown in FIG. 2 in more detail.

FIG. 3 is a diagram showing the digital-to-analog converter shown in FIG. 2 in more detail. In FIG. 3, those parts which have the same as those shown in FIG. 1 are given the same reference numerals. In FIG. 3, the input resistor network 4 does not have the resistors R12-R15 provided for the four high-order bits shown in FIG. 1. An input resistor network circuit 6 is composed of a 12-bit shift register 9 and a latch 10. On the other hand, the feedback resistor network 5, which is a feedback circuit of the adder 3, is composed of four series circuits respectively formed of a switch SW1 and a resistor R9, a switch SW2 and a resistor R10, a switch SW3 and a resistor R11, and a switch SW4 and a resistor R12, and a resistor R12 connected in parallel to the four series circuits. Each of the switches SW1-SW4 of the feedback resistor network 5 is selectively ON/OFF controlled by the feedback resistor network control circuit 7 made up of a four-bit shift register 11 and a latch 12.

A timing controller 13 receives clock pulses CLK1 and CLK2 and a digital input signal DATA from an external device, and outputs clock pulses CLK-A and CLK-B, and a reset pulse RST. The digital input signal DATA is output from the timing controller 13 as it is in addition to the purpose of generating the clock pulses CLK-A and CLK-B and the reset pulse RST. The clock pulse CLK 2 is output from the timing controller 13 as it is.

A description will now be given of the operation of the circuit shown in FIG. 3. First, the shift register 11 is set to an initial state in which "1" is written therein. As shown in FIG. 4, the bits of the digital input signal are successively stored in the shift registers 9 and 11 from the high-order bit in accordance with the clock pulses CLK1. During this operation, under the control of the timing controller 13, the digital input signal is written into the shift register 11 before "1" appears for the first time or four bits have been stored in the shift register 11. After that, the digital input signal is written into the shift register 9. After all the bits of the digital input signal have been selectively stored in the shift resistors 9 and 11, the clock pulse CLK2 is input to the latches 10 and 12, and the data stored in the shift registers 9 and 11 are input to the latches 10 and 12, respectively. The data written into the latch 10 controls the input resistor network 4. After the data are input to the latches 10 and 12, the shift register 11 is cleared and set to the initial state.

The operation will be explained more specifically. When the digital input signal is (0010101101111101), it is written in accordance with the clock pulses CLK1 in the order of 0010.... The two high-order bits from the beginning of the digital input signal are zeros, so that they are written into the shift register 11. The third high-order bit following the above two high-order bits is "1", so that it is written into the shift register 9. It will be noted that the 15th bit and 16th bit of the digital input signal (zero and one in the example being considered) are omitted since the shift register 11 are filled with bits higher than the 15th bit of the digital input signal. The converting precision may slightly deteriorate by the last two bits. When all the 16-bit data have been input, the data stored in the shift registers 9 and 11 are input to the latches 10 and 12, respectively. Thus, the input terminal of the adder 3 is supplied, via the input resistor network 4, with analog signals based on the bits between the third high-order bit and 14th bit, that is, (101011011111). These analog signals are added in accordance with a gain defined by the two series circuits of switches SW3 and SW4 specified by the first two high-order zero bits and the corresponding resistors as well as the resistor R12.

Figure 5:
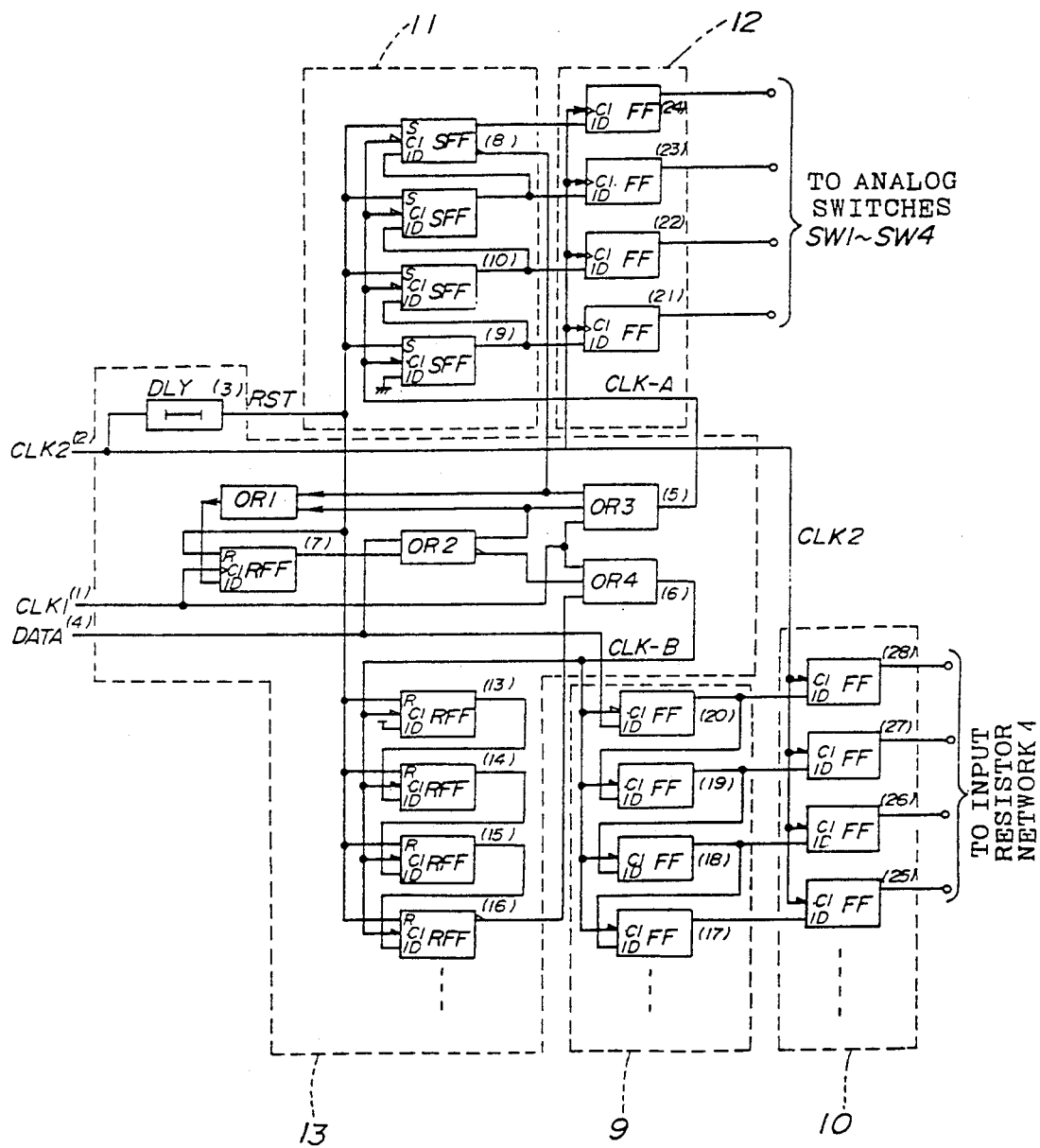
FIG. 5 is a circuit diagram of an essential part of the structure shown in FIG. 3.

FIG. 5 is a circuit diagram of the shift register 9, the latch 10, the shift register 11, the latch 12 and the timing controller 13. The shift register 9 has (n−m) flip-flops where the digital input signal consists of n bits, and the shift register 11 has a capacity equal to bits m. In the case shown in FIG. 5, since n=16 and m=4, the circuit has 12 flip-flops (only four flip-flops are illustrated for the sake of simplicity). In FIG. 5, (1)–(28) indicate signal lines or structural members. Flip-flop FF (20) inputs the digital input signal DATA, which is transferred in synchronism with the clock pulse CLK-B output by the timing controller 13.

The latch 10 has (n−m) flip-flops FF, and inputs data from the shift register 9 in synchronism with the clock pulse CLK2. The shift register 11 has four flip-flops SFF, each having a preset function. The flip-flops SFF are preset to 1 when they receive the reset pulse RST output by the timing controller 13. As a data input terminal of the flip-flop SFF (9) is grounded, "0" is successively shifted each time the clock pulse CLK-A output by the timing controller 13 is applied thereto. The latch 12 has four flip-flops FF. When the clock pulse CLK2 is applied to the flip-flops FF of the latch 12, they latch the outputs of the shift register 11.

The timing controller 13 has two two-input OR circuits OR1 and OR2, two three-input OR circuits OR3 and OR4, five flip-flop RFF, each having the reset function, and a delay circuit DLY.

During the time zeros are successively supplied starting from the most significant bit of the digital input signal, the clock pulses CLK-A are successively output by the OR circuit OR3. After "1" appears for the first time, the clock pulse CLK-B are successively output by the OR circuit 4.

The flip-flops RFF (13)–(16) are reset in response to the reset signal RST output by the delay circuit DLY. Since a data input terminal of the flip-flop RFF (13) is fixed to a high-potential power supply voltage Vcc, "1" is successively shifted each time the clock pulse CLK-B is applied. When "1" has been written into the last flip-flop RFF (RFF (16) in the structure shown in FIG. 5), the inverted version of this "1", that is, "0" is applied to the OR circuit OR4 in synchronism with the next clock pulse CLK-B. Thus, the OR circuit OR4 stops outputting the clock pulse CLK-B.

Figure 7A:
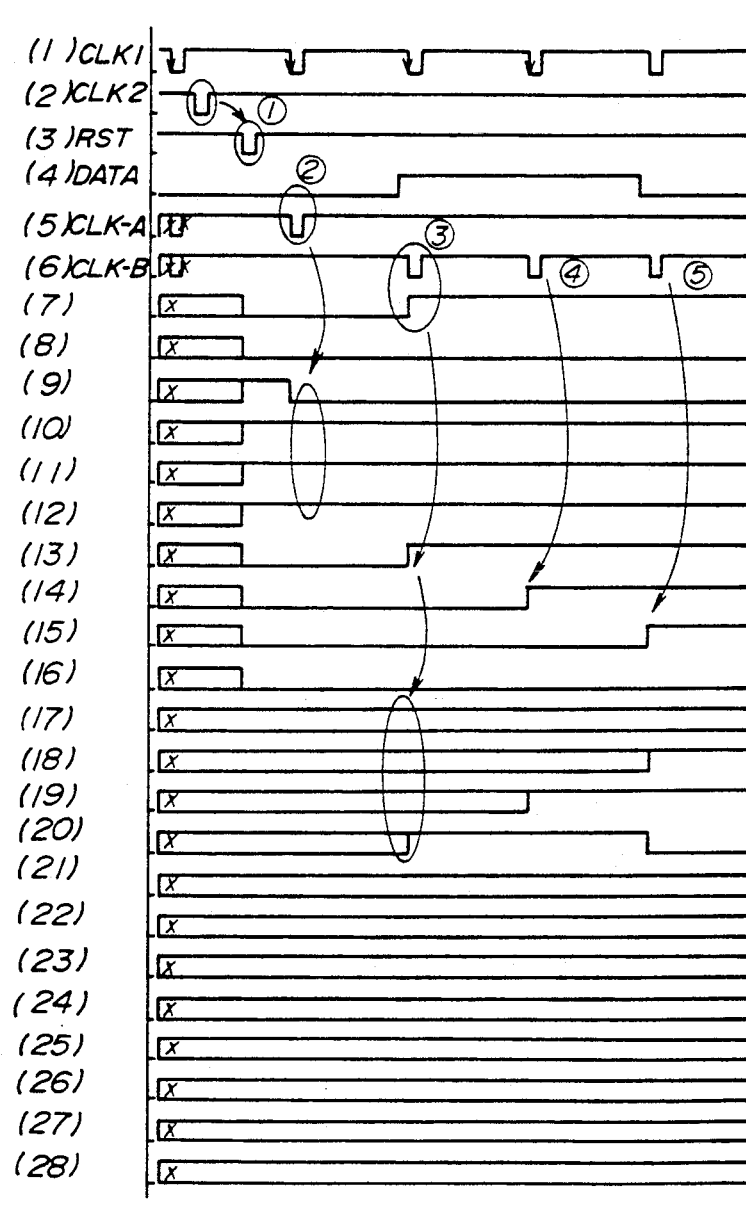
FIGS. 7A, 7B, 7C, 7D, 7E and 7F are combined together.
Figure 7B:
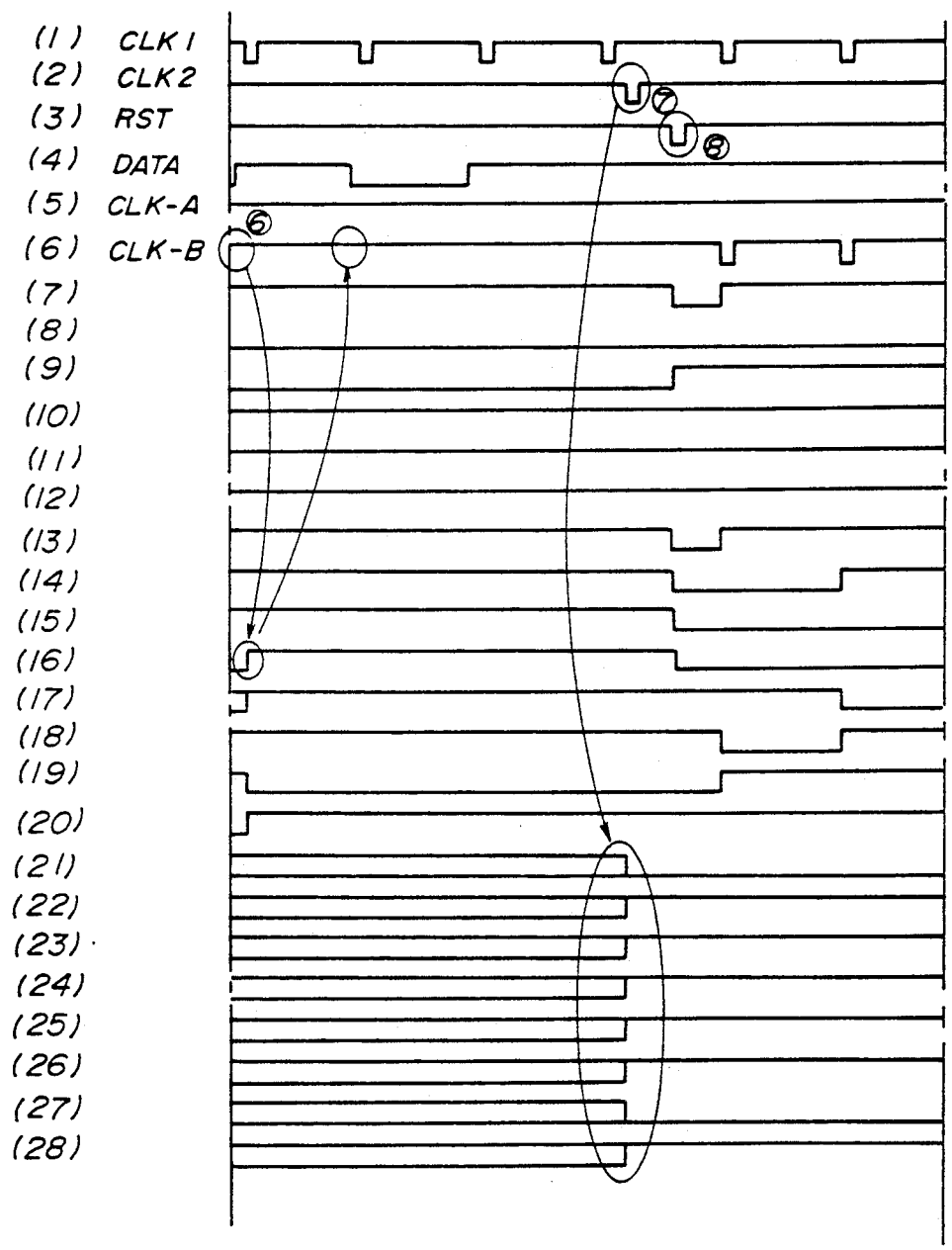

FIGS. 7A and 7B show the operation obtained when the digital input signal DATA is 0110100. The clock pulse CLK2 is generated in response to the end of the previous digital input signal. The delay circuit reset pulse RST (see ① in FIG. 7A). Thus, the shift register shown in FIG. 5 delays the clock pulse CLK2 and outputs the reset pulse RST (see /e,crc/1/ in FIG. 7A). Thereby, the flip-flops SFF of the shift register 11 and the four flip-flops RFF of the timing controller 13 shown in FIG. 5 are set to the initial states.

In synchronism with the fall of each clock pulse CLK1, the digital input signal DATA is transferred. The clock pulse CLK-A is generated in synchronism with the fall of the clock pulse which appears for the first time after the reset pulse RST is generated (see ② shown in FIG. 2). The flip-flop SFF (9) of the shift register latches the most significant bit of the digital input signal DATA, "0", in synchronism with the clock pulse CLK-A.

In synchronism with the fall of the next clock pulse CLK1, bit "1" of the digital input signal is input. At the same time, the output of the flip-flop RFF (7) rises, and the clock pulse CLK-B falls (see ③ in FIG. 7A). That is, the clock pulse CLK-B is output in place of the clock pulse CLK-A. The flip-flop (20) latches bit "1" in synchronism with the fall of the clock pulse CLK-B. At the same time, "1" is latched in the flip-flop (13).

In the same way, one bit of the digital input signal DATA is input to the flip-flop (20) in synchronism with the fall of the clock pulse CLK1, and the bits which have been previously input are transferred to the shift registers (19)–(17) of the next stages (see ④ and ⑤ in FIG. 7A).

In FIG. 5, for the sake of simplicity, the shift register 9 and the latch 10 are each formed of a four-bit shift register. Thus, at the time the clock pulse CLK-B falls, the four flip-flops FF (17)–(20) of the shift register 9 latch bits "1101" of the second through fifth high-order bits of the digital input signal DATA, respectively.

When the clock pulse CLK-B falls, "0" obtained by inverting the "1" from the flip-flop RFF (16) is applied to the OR circuit OR4. Thus, the OR circuit OR4 stops outputting the clock pulse CLK-B, and the bits equal to and lower than the sixth bit of the digital input signal DATA are omitted. After that, in synchronism with the clock pulse CLK2 showing the end of the digital input data DATA (transfer instruction), data stored in the shift register 11 are transferred to the latch 12, and data stored in the shift register 9 are transferred to the latch 10 (see ⑦ in FIG. 7B). The four flip-flops SFF of the shift register 11 and the four flip-flops RFF (13)–(16) of the timing controller 13 are initialized.

Figure 7C:
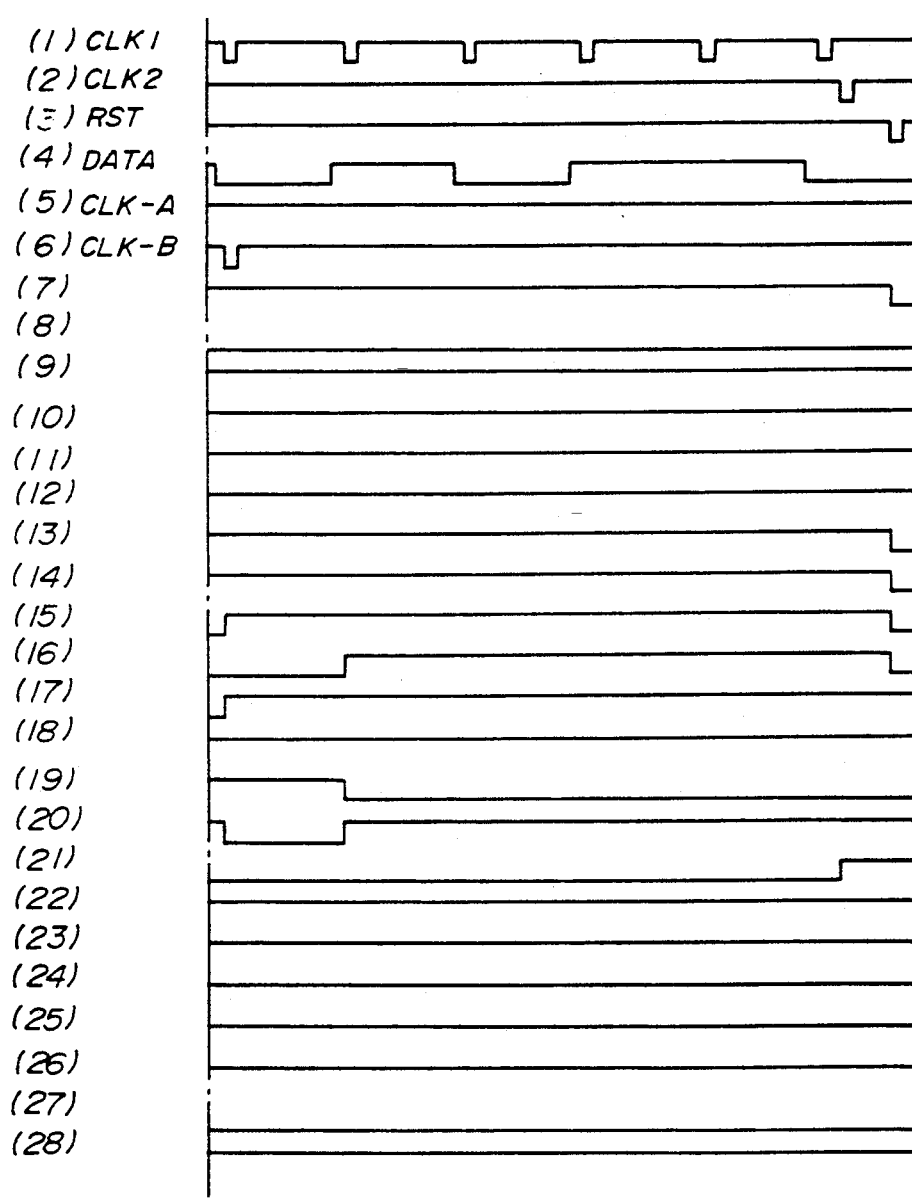

FIGS. 7B AND 7C show the operation obtained when the digital input signal DATA is "11010110". Since the most significant bit of this digital input signal DATA is "1", the clock pulse CLK-A is not generated, and the clock pulse CLK-B is immediately output.

Figure 7D:
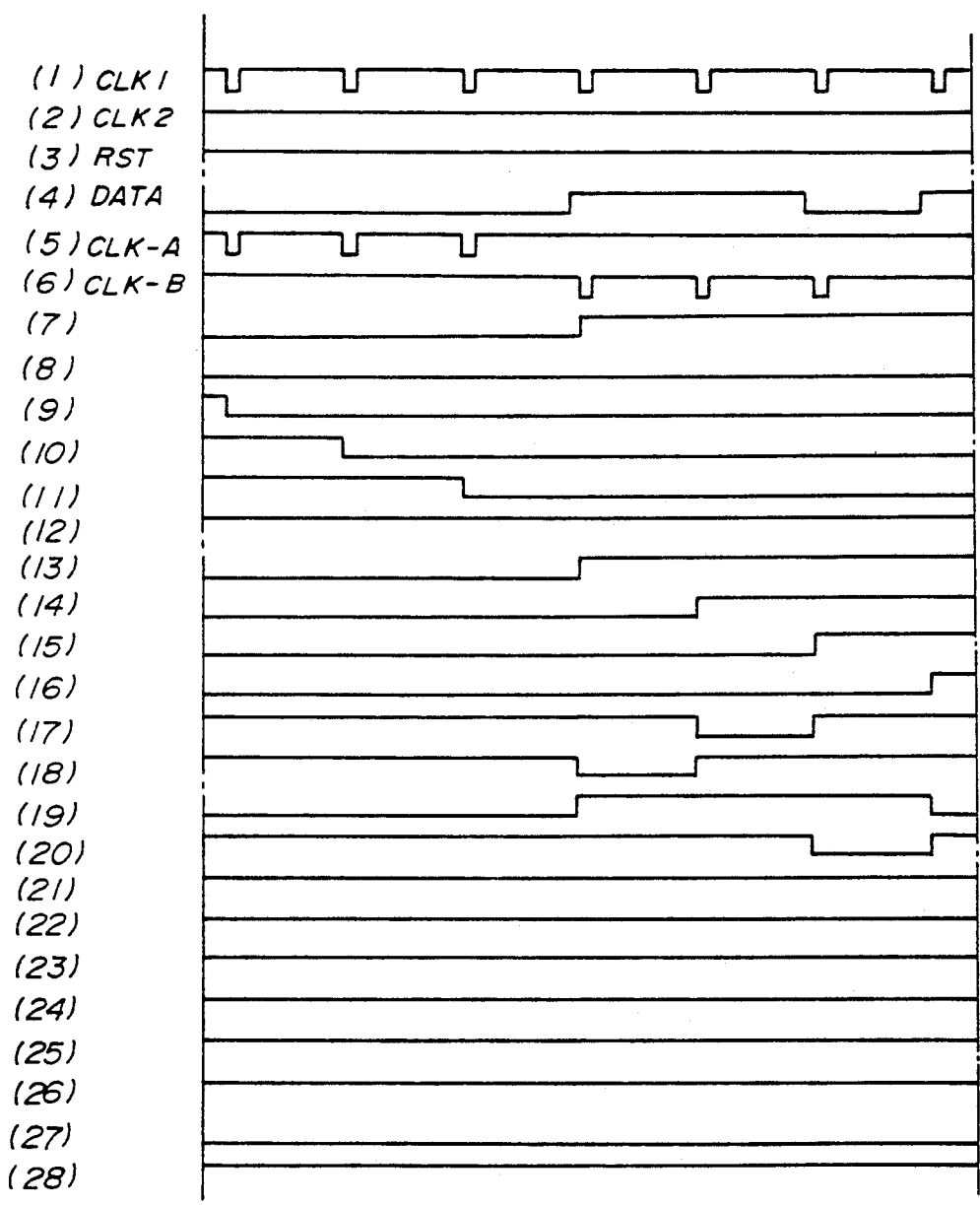
Figure 7E:
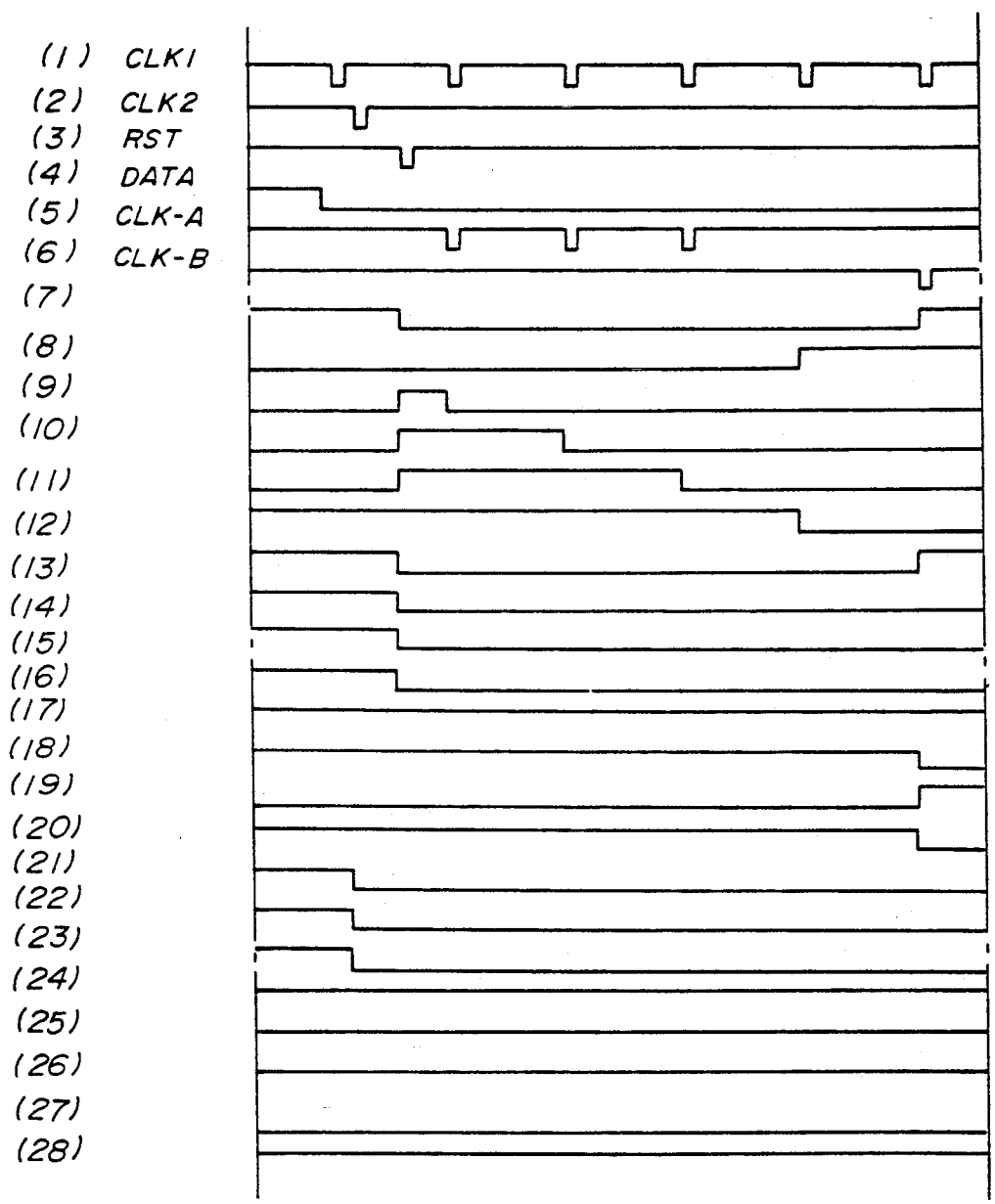
Figure 7F:
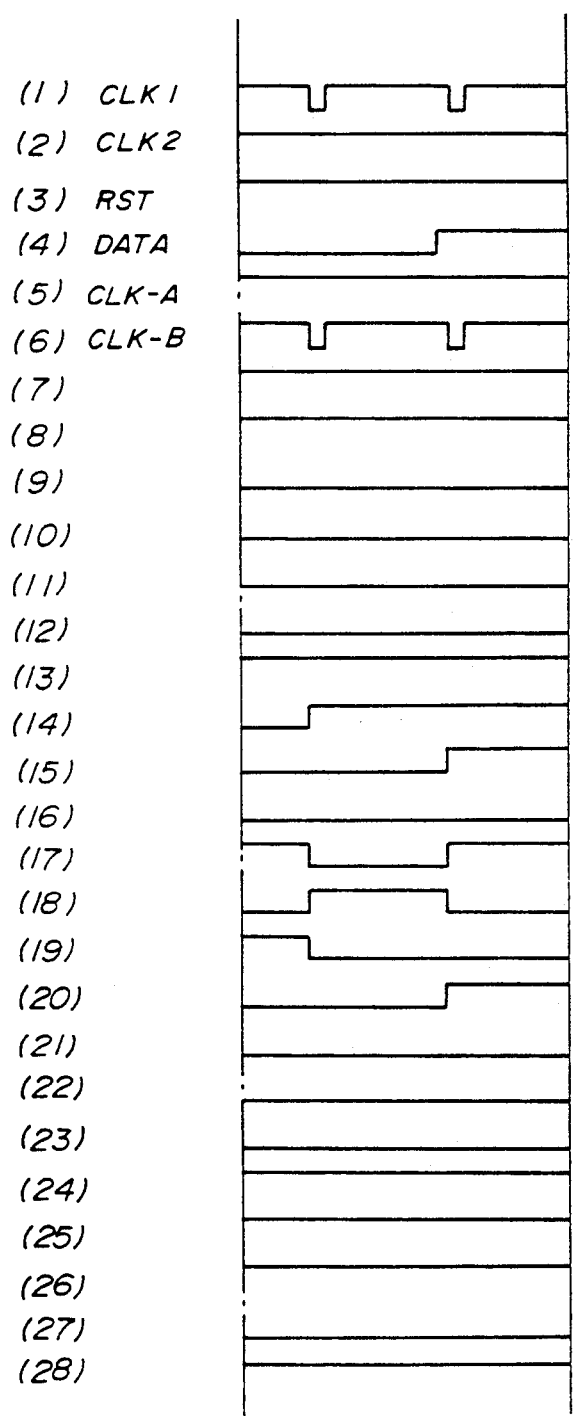

FIGS. 7D and 7E show the operation obtained when the digital input signal DATA is "00011010". FIGS. 7E and 7F show the operation obtained when the digital input signal DATA is "00000010".

Figure 8:
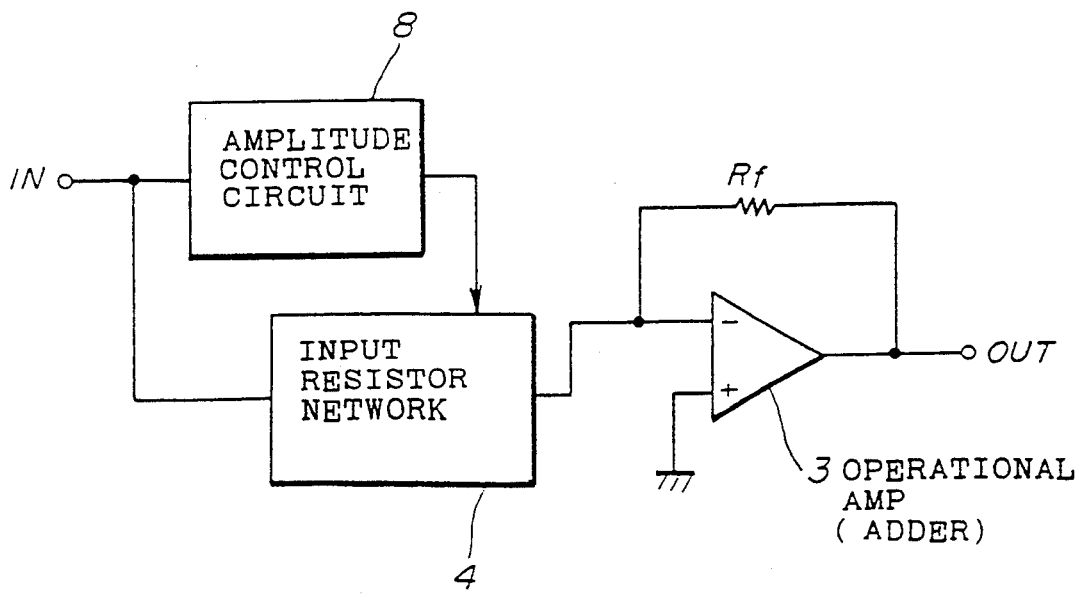
FIG. 8 is a block diagram illustrating the principle of the digital-to-analog converter according to a second embodiment of the present invention.

A description will now be given of the digital-to-analog converter according to the second embodiment of the present invention. FIG. 8 is a block diagram showing the principle of the digital-to-analog converter according to the second embodiment. In FIG. 8, the inverting input terminal of the adder formed of the operational amplifier 3 is connected to the input resistor network 4, and a feedback resistor Rf is connected to the inverting input terminal and output terminal of the operational amplifier. The amplitude of the output signal of the input resistor network 4 is controlled on the basis of the magnitude of the digital input signal.

The second embodiment changes the magnitude of the input signal of the adder. The input resistor network 4 does not have resistors related to high-order bits, so that a smaller ratio of the largest resistance to the smallest resistance can be obtained. The amplitude of the output signal of the input resistor network 4 is set to an appropriate value dependent on the magnitude of the digital input signal.

Figure 9:
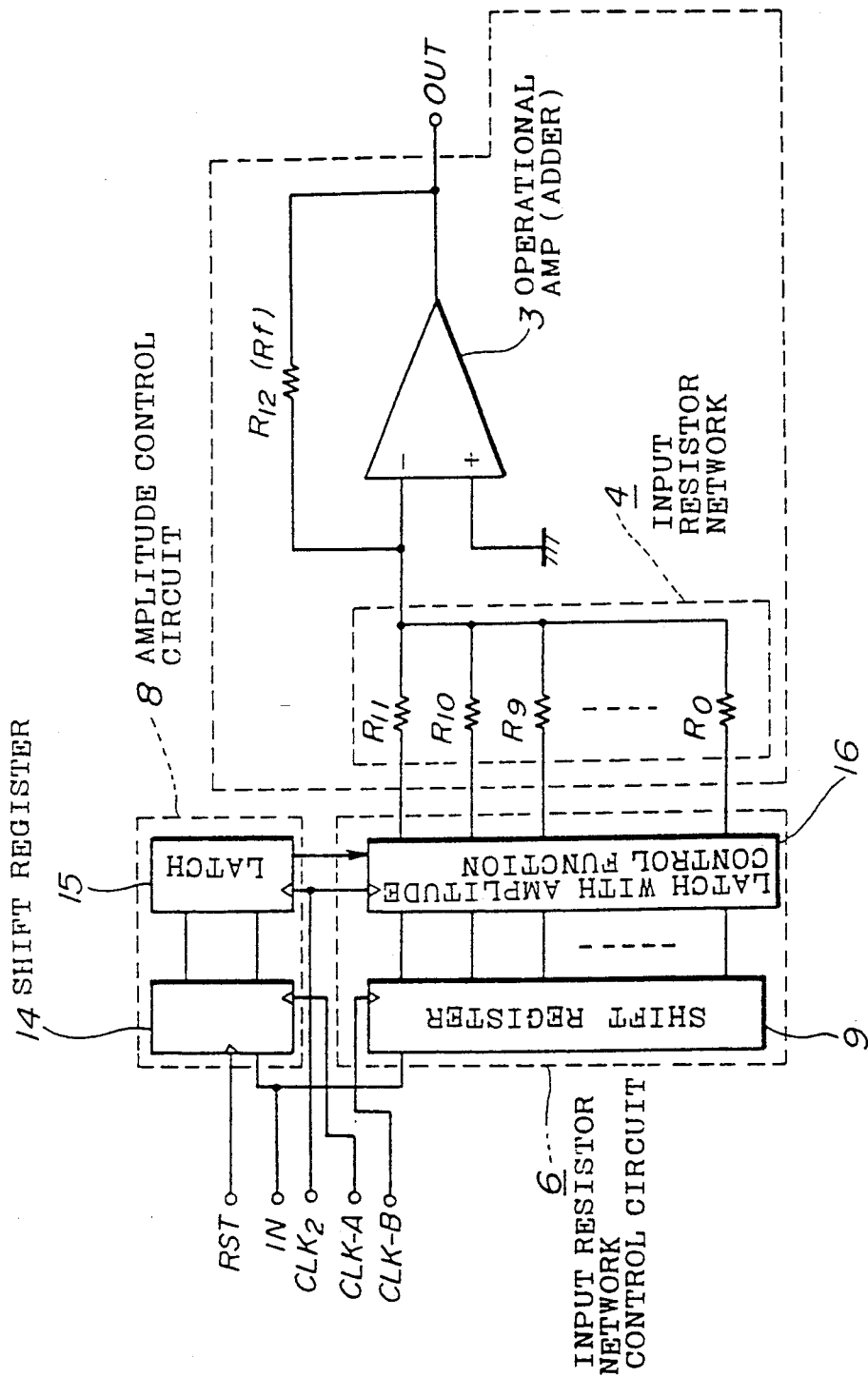
FIG. 9 is a diagram showing the digital-to-analog converter shown in FIG. 8 in more detail.

FIG. 9 is a block diagram showing the structure shown in FIG. 8 in more detail. In FIG. 9, those parts which are the same as those shown in FIG. 3 are given the same reference numerals. In FIG. 9, the input resistor network 4 does not have resistors R12–R15 related to the four high-order bits in the same way as that shown in FIG. 3. Similarly, the input resistor network control circuit 6 is made up of a 12-bit shift register 9 and a latch 16. The latch 16 is formed of a latch circuit having a known amplitude limit function. The amplitude of an output circuit of the latch 16 is controlled by an output circuit of an amplitude control circuit 8, which is composed of a four-bit shift register 14 and a latch 15. The resistor R12 functions as the feedback circuit of the adder 3, so that a fixed gain can be obtained.

Initially, the shift registers 9 and 14 are set to "0". The bits of the digital input signal are stored in the shift registers 9 and 14, starting from the most significant bit in synchronism with the clock pulses CLK-A and CLK-B, as shown in FIG. 4. Successive bits of the digital input signal are stored in the shift register 14 until "1" appears for the first time or four bits are stored in the shift register 14. After that, the other bits of the digital input signal are stored in the shift register 9. After the bits of the digital input signal are stored in the shift registers 9 and 14 in the above-mentioned way, the clock pulse CLK2 is input to the latches 16 and 15, so that the data stored in the shift registers 9 and 14 are input to the latches 16 and 15, respectively. The data input to the latch 16 controls the input resistor network 4, and the data input to the latch 15 controls the amplitude of the output signal of the input register network 4. After the data are input to the latches 16 and 15, the shift registers 9 and 14 are cleared and set to the initial state.

In the same way as shown in FIG. 3, the operation obtained when the digital input signal is (0010101101111101) will be described. The digital input signal is stored in the order of 0010... in synchronism with the clock pulses CLK-A. The two bits from the most significant bit are "0", and thus stored in the shift register 14. On the other hand, the third bit of the digital input signal is "1", and thus written into the shift register 9 in synchronism with the clock pulse CLK-B. The bits following the third bit are also written into the shift register 9 in synchronism with the clock pulses CLK-B. The 15th and 16th bits are not stored in the shift register 9, since there is no capacity of storing such two bits. That is, these two bits are omitted. The data available in the shift registers 9 and 14 when the 16th bit is input are input to the latches 16 and 15 in synchronism with the clock pulses CLK2. As a result, analog signals based on data (101011011111) between the third bit and the 14th bit are applied to the input terminal of the adder 3 via the input register network 4. The amplitudes of these analog signals are limited to a predetermined value (a quarter of the largest amplitude) based on the first two bits (00). The adder 3 adds and amplifies the amplitude-limited analog signals in accordance with a gain defined by the resistor R12.

The second embodiment makes it possible to reduce the ratio of the largest resistance to the smallest resistance. In addition, the dynamic range is prevented from becoming small, since the amplitude of each analog signal is limited to an appropriate value based on the magnitude of the input digital signal.

Portions surrounded by the broken lines shown in FIGS. 3 and 9 are the same as each other (12-bit adder). In a case where a plurality of bits (n bits) are passed and some remaining bits are latched in the latch 10 and/or latch 13, the output obtained is $2^n$ times greater than the original output. For example, the same data is input to the latches 10 and 13 for (01101010111001111) and (00110101011100111). However, the latter data is one-bit shifted, so that there is a twice magnitude difference. Such a magnitude difference is compensated for by an arrangement in which the resistance Rf is set equal to $\frac{1}{2}$ in the first embodiment and by an arrangement in which the amplitude of the input signal is set equal to be half in the second embodiment.

According to the aforementioned embodiments of the present invention, a dynamic range equal to 96 dB can be ensured by selectively omitting four bits of the digital input signal. When the digital input signal shows a small value (one or more leading bits are zero), such one or more zero-bits are omitted. On the other hand, when the digital input signal has a large value (the leading bit is binary one), low-order bits are omitted. With this arrangement, it becomes possible to convert the digital input signal to an analog signal in the range between the smallest value (0000000000000001) and a value close to the largest value, (1111111111110000). It will be seen from calculation that the dynamic range is equal to 96.3 dB.

In addition, it is possible to provide compact digital-to-analog converters. In the conventional digital-to-analog converter shown in FIG. 1, the resistor network consisting of resistors R0–R15 occupies approximately $\frac{2}{3}$ of the entire area used for forming the digital-to-analog converter. Since resistance is proportional to length, the total sum of the resistance values determines the area of the resistor network. Assuming that R0=1 in FIG. 1, the total sum of the resistance values of the resistor network is as follows:

$$R0+R1+...+R15+R16=10\times 10^3 \times (2^0+2^1+...+ 2^{15}+2^{16})$$

where $2^0+2^1+...+2^n=w^{n+1}-1$.

Thus, the following is obtained:

$$R0 + ... + R16 = 10^4 \times (2^{17} - 1) \qquad (1)$$
$$= 10^4 \times 131071.$$

On the other hand, the total sum of the resistance values in FIG. 3 is:

$$(2)$$

(total sum of the resistance values of input resistor network 4) + (total sum of the resistance values of feedback resistor $$\text{network 5}) = 10^4 \times [(12^{12} - 1) + 2^7]$$
$$= 10^7 \times 512.$$

From formulas (1) and (2), the ratio of the resistor network area according to the present invention to that of the conventional arrangement is as follows:

$$(10^4 \times 512)/10^4 \times 131071 \approx 0.059 - 5.9\%.$$

That is, it becomes possible to reduce the area to 5.9% of the conventional area.

The ratio of the entire size of the digital-to-analog converter shown in FIG. 3 to that of the digital-to-analog converter shown in FIG. 1 is as follows:

$$[(\tfrac{1}{3})+(\tfrac{2}{3})0.059]/[(\tfrac{1}{3})+(\tfrac{2}{3})] = 0.37$$

That is, the digital-to-analog converter has a size equal to 3.7% of that of the conventional one. However, it will be noted that the size of the digital circuit is negligible as compared with the size of the resistor network and thus the above discussion does not take into account the size of the digital circuit.

The present invention are suitable for applications necessary for digital-to-analog conversion.

I claim:

1. A digital-to-analog converter of a current addition type having weighted resistors, comprising:
    input resistor network means for receiving a digital input signal having a predetermined number of bits, and having a resistance dependent on the digital input signal;
    addition means having a first input terminal coupled to said input resistor network means and a second input terminal connectable to receive a reference potential and an output terminal, for adding a signal obtained from said first input terminal and the reference potential and for providing on said output terminal a result of the adding operation as an analog signal corresponding to the digital input signal;
    input resistor network means comprising a smaller number of resistors than the predetermined number of bits of the digital input signal; and
    control means for applying a voltage dependent on a magnitude of the digital input signal to one end of each of said resistors, said control means including first means for holding zeros of the digital input signal successively obtained starting from a most significant bit of the digital input signal; and
    second means for varying the voltage applied to said one end of each of said resistors based on a number of the zeros successively obtained.

2. A digital-to-analog converter as claimed in claim 1, wherein said second means comprises:
    shift register means for holding bits of the digital input signal which include bit "1" when the bit "1" appears starting from the most significant bit of the digital input signal and which include bits subsequent to the bit "1"; and
    latch means for selecting some of said resistors of said input resistor network means corresponding to the bits held in said shift register means and for applying the voltage to the one end of each of said selected resistors.

3. A digital-to-analog converter of a current addition type using weighted resistors, comprising:
    input resistor network means for receiving a digital input signal having a plurality of bits applied to a digital-to-analog converter and having a resistance dependent on the digital input signal;
    addition means having a first input terminal coupled to said input resistor network means, a second input terminal connectable to receive a reference potential and for providing on said output terminal a result of the adding operation as an analog signal corresponding to the digital input signal;
    a feedback resistor network provided between said first input terminal and said output terminal of said addition means, said feedback resistor network having a feedback resistance dependent on a control signal indicating a magnitude of the digital input signal; and
    control means, coupled to said input resistor network and said feedback resistor network, for applying the input digital signal received in serial form to the feedback resistor network so that one or more "0" bits of the input digital signal received before a "1" bit of the input digital signal appears for the first time, are applied to the feedback resistor network, and for applying the input digital signal to the input resistor network so that said "1" bit and bits of the input digital signal subsequent to the "1" bit are applied to the input resistor network.

4. A digital-to-analog converter as claimed in claim 3, wherein the input resistor network means includes a smaller number of resistors than a number of the plurality of bits.

5. A digital-to-analog converter as claimed in claim 4, wherein said control means determines the "1" bit appearing for the first time starting with the most-significant-bit (MSB).

6. A digital-to-analog converter as claimed in claim 3, wherein said feedback resistor network includes means for generating, based on a number of binary zeros successively obtained from a most-significant-bit (MSB) of the digital input signal, a control signal indicating the magnitude of the digital input signal.

7. A digital-to-analog converter as claimed in claim 3, wherein:
    said feedback resistor network comprises a predetermined number of series circuits, each having a resistor and a switch, and a reference resistor,
    a first end of each of said series circuits being connected to said first input terminal of said addition means, and a second end of each of said series circuits connecting to the output of said additional means; and
    said reference resistor connecting to said first input terminal and said output terminal of said addition means.

8. A digital-to-analog converter as claimed in claim 7, wherein:
    each of said series circuits includes a control terminal which receives the control signal; and
    said resistor of each of said series circuits connecting to said first input terminal of said addition means when said corresponding switch is turned ON by the control signal.

9. A digital-to-analog converter as claimed in claim 8, wherein:
    the control signal has bits equal in number to the predetermined number of said series circuits;
    each of the bits of the control signal is applied to the control terminal of a corresponding one of said series circuits; and
    said switch of the corresponding one of said series circuits including means for turning on in response to at least one bit among the plurality of bits of the control signal which are set, based on an occurence of the "1" bit appearing for the first time from the MSB of the digital input signal.

10. A digital-to-analog converter as claimed in claim 8, wherein said feedback resistor network means comprises:
shift register means for generating a bit value which causes said corresponding switch to turn ON each time a consecutive "0" bit of the digital input signal occurs, starting from a MSB of the digital input signal.

11. A digital-to-analog converter as claimed in claim 7, wherein the resistor of one of said series circuits corresponding to the MSB has a resistance equal to said reference resistor.

12. A digital-to-analog converter as claimed in claim 3, wherein said digital input signal has the plurality of bits arranged in series.

13. A digital-to-analog converter as claimed in claim 3, wherein:
said input resistor means includes
shift register means for successively shifting the plurality of bits of the digital input which include the "1" bit when the "1" bit appears for the first time starting from the MSB of the digital input signal and which includes the bits subsequent to the "1" bit,
latch means for transferring and storing the bits in said shift register means; and
a predetermined number of resistors, which are selected based on the bits transferred from the latch means; and
said control means includes
a predetermined number of series circuits;
a reference resistor connected between said first input terminal and said output terminal of said addition means, each of said series circuits having a resistor, a switch, a first end and a second end, the first end of each of said series circuits connecting to said first input terminal of said addition means, and the second end of each of said series circuits connecting to the output terminal of said addition means;
shift register means for generating a bit value which causes said corresponding switch to turn ON each time one of said consecutive "0" bits of the digital input signal starting from an MSB, is input, and
latch means for supplying said control terminal of said switch of a corresponding one of said series circuits with the bit value stored in said shift register means after the most significant bit of the digital input signal, is input.

14. A digital-to-analog converter as claimed in claim 13, further comprising timing controller means for generating a first clock signal when "0" bits of the digital input signal are successively being input starting from the MSB and for generating a second clock signal after the bit "1" of the digital input signal first appears,
wherein said shift register means of said feedback resistor network control means includes means for operating in synchronism wiht the first clock signal, and
wherein said shift register means of said input resistor network includes means for operating in synchronism with the second clock signal.

15. A digital-to-analog converter as claimed in claim 14, wherein said timing controller means includes means for generating the first clock signal and the second clock signal from the digital input signal and for generating a clock pulse indicating a transfer timing of the digital input signal.

16. A digital-to-analog converter as claimed in claim 3, wherein said addition means includes an operational amplifier.

17. A digital-to-analog converter receiving a digital input signal and a reference voltage, comprising:
an operational amplifier having inverting, non-inverting and output terminals, the non-inverting terminal being coupled to receive the reference voltage;
a feedback resistor network including at least one series circuit including a switch and a resistor connected in series, the at least one series circuit being coupled between the inverting and output terminals;
a feedback resistor network control circuit coupled to the feedback resistor network and coupled to receive the digital input signal, which generates a switch signal to control the switch based on a first occurrence of a bit having a first state, starting from a most significant bit (MSB) of the digital input signal; and
an input resistor network including a plurality of resistors having first ends coupled to the inverting terminal, and having second ends receiving respective bits of the digital input signal starting from the first occurrence of the bit having the first state to a least significant bit (LSB) of the digital input signal.

18. A digital-to-analog converter receiving a reference voltage and a digital input signal, comprising:
an operational amplifier having inverting, non-inverting and output terminals, the non-inverting terminal being coupled to receive the reference voltage;
a feedback resistor coupled between the inverting and output terminals;
an input resistor network including a plurality of resistors having first ends connected to the inverting terminal and having second ends coupled to receive respective bits of an amplitude-controlled digital signal;
an input resistor network control circuit coupled to the input resistor network and to receive the digital input signal, for generating the amplitude-controlled digital signal based on a control signal and the digital input signal; and
an amplitude control circuit coupled to the input resistor network control circuit and to receive the digital input signal, which generates the control signal to modify an amplitude of the amplitude-controlled digital signal, based on a first occurrence of a bit having a first state starting from a most significant bit (MSB) of the digital input signal.

* * * * *

UNITED STATES PATENT AND TRADEMARK OFFICE
CERTIFICATE OF CORRECTION

PATENT NO. : 5,307,065
DATED : Apr. 26, 1994
INVENTOR(S) : TOKUHIRO

It is certified that error appears in the above-indentified patent and that said Letters Patent is hereby corrected as shown below:

On the title page: Item [56]

[56] References Cited, under the heading "FOREIGN PATENT DOCUMENTS" please insert the following references:

| | | |
|---|---|---|
| 54-101076 | 8/1979 | Japan |
| 56-102118 | 8/1981 | Japan |
| 58-060821 | 4/1983 | Japan |

Col. 4, line 17, change "have" to --are--.

Col. 6, line 1, change "/e,crc/1/" to --①--.

Col. 8, line 52, change " $=w^{n+1}$ " to -- $=2^{n+1}$ --.

Col. 9, line 5, in the equation change "≈" to --÷--; line 55, before "appears" insert --first--.

Col. 10, line 46, change "additional" to --addition--.

Col. 12, line 1, change "wiht" to --with--.

Signed and Sealed this

Twenty-seventh Day of September, 1994

Attest:

BRUCE LEHMAN

*Attesting Officer*     *Commissioner of Patents and Trademarks*